United States Patent [19]

Lippmann et al.

[11] Patent Number: 5,371,500
[45] Date of Patent: Dec. 6, 1994

[54] MAINTAINING RATIOMETRIC DATA IN ELECTRONICALLY MANIPULATED SIGNAL PROCESSING SYSTEMS

[75] Inventors: Raymond Lippmann, Ann Arbor; James E. Nelson, Waterford; Michael J. Schnars, Clarkston; James R. Chintyan, Davison; Mark C. Hansen, Ann Arbor, all of Mich.; Edward H. Honnigford, Russiaville, Ind.

[73] Assignee: Delco Electronics Corporation, Kokomo, Ind.

[21] Appl. No.: 944,145

[22] Filed: Sep. 11, 1992

[51] Int. Cl.⁵ .................. H03M 1/12; H03M 1/78; H03M 1/06
[52] U.S. Cl. ..................... 341/155; 341/154; 341/126; 341/118
[58] Field of Search ............... 341/155, 154, 127, 126, 341/158, 118

[56] References Cited

U.S. PATENT DOCUMENTS

| | | | |
|---|---|---|---|
| 3,115,615 | 12/1963 | Saper | 340/37 |
| 3,983,549 | 9/1976 | Akita et al. | 340/206 |
| 3,990,073 | 11/1976 | Duttweiler | 340/347 |
| 4,102,191 | 7/1978 | Harris | 73/313 |
| 4,243,974 | 1/1981 | Mack | 340/347 |
| 4,250,750 | 2/1981 | Martinec et al. | 73/308 |
| 4,309,692 | 1/1982 | Crosby | 340/347 |
| 4,386,406 | 5/1983 | Igarashi et al. | 364/442 |
| 4,470,296 | 9/1984 | Kobyashi et al. | 73/113 |
| 4,481,597 | 11/1984 | Robbins | 364/604 |
| 4,546,343 | 10/1985 | Higgins et al. | 340/347 |
| 4,614,114 | 9/1986 | Matsumoto et al. | 73/313 |
| 4,635,043 | 1/1987 | Kronenberg et al. | 340/618 |
| 4,760,736 | 8/1988 | Huynh | 73/430 |
| 4,768,377 | 9/1988 | Habelmann et al. | 73/313 |
| 4,810,953 | 3/1989 | Huynh | 324/120 |
| 4,890,491 | 1/1990 | Vetter et al. | 73/290 |
| 4,897,822 | 1/1990 | Korten et al. | 367/124 |
| 4,912,646 | 3/1990 | Cerruti | 364/509 |
| 4,916,535 | 4/1990 | Volodchenko et al. | 358/101 |
| 5,028,926 | 7/1991 | Tokuhiro | 341/161 |
| 5,119,097 | 6/1992 | Ohkura et al. | 341/158 |
| 5,126,740 | 6/1992 | Kawada | 341/144 |
| 5,160,930 | 11/1992 | Hosotani et al. | 341/154 |
| 5,175,548 | 12/1992 | Kawada | 341/144 |
| 5,210,537 | 5/1993 | Mangelsdorf | 341/156 |

OTHER PUBLICATIONS

Electronic Circuits—Digital and Analog, Charles A. Holt, pp. 794–795, 1978.

Primary Examiner—Sharon D. Logan
Attorney, Agent, or Firm—Anthony L. Simon; Jimmy L. Funke

[57] ABSTRACT

A circuit apparatus comprises interface circuitry between analog and digital circuitry. A multiple reference circuit provides a variety of reference voltage signals. The multiple reference circuitry is coupled to a selection circuit that selectively couples one of the reference voltage signals to a first reference input of the interface circuitry and selectively couples another of the reference voltage signals to a second reference input of the interface circuitry, whereby the first and second reference inputs may be selectively coupled to the reference voltages and the circuit maintains a ratiometric relationship between the digital and analog circuitry.

10 Claims, 6 Drawing Sheets

MAINTAINING RATIOMETRIC DATA IN ELECTRONICALLY MANIPULATED SIGNAL PROCESSING SYSTEMS

The subject of this specification is related to copending applications, U.S. Ser. Nos. 07/944,148, entitled "Slew Rate Limiter with Asymmetrical Operation," 07/944,154, entitled "Fuel Wobbler," 07/944,140 entitled "Electronic Gauge Transform," and 07/943,964, entitled "Gauge Glider," all filed concurrently with this specification, assigned to the assignee of this invention, and the disclosures of which are incorporated by reference.

This invention relates to signal processing systems and more particularly to signal processing systems in which a supply voltage may vary and in which parameter measurements are made.

BACKGROUND OF THE INVENTION

In certain types of signal processing systems, such as parameter measurement and display systems found in motor vehicles, the system supply voltage is not regulated. When the supply voltage is not regulated the parameter senders and sensors may provide output signals that vary with the supply voltage. Electronic processing circuitry within the system for processing the sender signals may have built in regulated voltage supplies, as is required in many integrated circuit systems.

When a sender output signal varies with vehicle supply voltage, and the signal processing circuitry includes a regulated supply voltage, the output of the system may indicate that the parameter being measured is varying, when in fact it is the vehicle supply voltage that is varying. To add regulated voltage supplies for all of the vehicle senders may be an expensive method of overcoming this tendency.

What is desired is a means for parameter measurement and signal processing for systems where the supply voltage may vary and the signal processing circuitry has regulated voltage supplies. It is desirable for the system to be unaffected by supply voltage variations and is suitable for installation into different types of systems.

SUMMARY OF THE PRESENT INVENTION

The present invention provides a means for interfacing sender output signals with signal processing circuitry so that the output of the signal processing circuitry is unaffected by variations in the sender output signals caused by system supply voltage variations. This invention may also be used to interface the signal processing circuitry with analog output devices that may be tied to the unregulated voltage supply, while insulating the output device from the affects of signal variations.

Additional advantages of the present invention include providing a system in which various types of sender outputs may be interfaced with processing circuitry. The processing circuitry may in turn be interfaced with various types of output devices requiring various slope and offset values in an output signal.

Structurally, this invention comprises a multiple reference circuit means coupled to an unregulated voltage supply and providing multiple reference signals at various signal levels. A means for interfacing digital and analog circuitry is provided, and has positive and negative reference inputs. A select means couples the positive reference input of the interfacing means to a first reference signal of the multiple reference circuit means and couples the negative reference input of the interfacing means to a second reference signal of the multiple reference circuit means.

A more detailed description of this invention along with other improvements and advantages is set forth below.

DETAILED DESCRIPTION OF THE INVENTION

Figure 1:
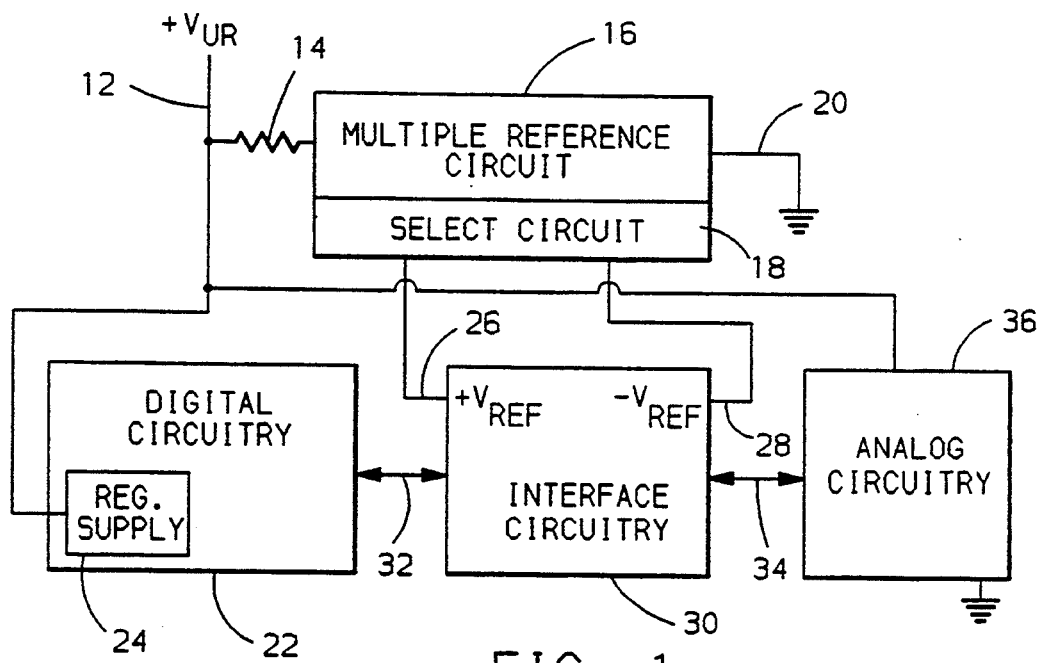
FIG. 1 is a schematic diagram of the circuit apparatus of this invention.

Referring to FIG. 1, an unregulated system supply voltage, Vur, is supplied for the system shown on line 12. A load resistor 14 couples the supply voltage on line 12 to multiple reference circuit means 16, which is grounded at line 20. Line 12 is coupled to digital circuitry 22, which typically has its own regulated voltage supply 24 to supply a fixed regulated voltage to digital circuitry 22. Analog circuitry 36 also receives power from line 12. An interface circuit means 30 interfaces between the digital circuitry 22 and analog circuitry 36 through lines 32 and 34, performing such functions as analog to digital signal conversion and digital to analog signal conversion as needed. The analog circuitry 36 has no regulated voltage supply and performs functions which are affected by variations in the supply voltage on line 12.

In order to maintain a constant ratiometric relationship between the analog and digital circuitry, the output of the interface circuit means 30 must be rendered insensitive to variations in the functions of analog circuitry 36 due to variations in the supply voltage. This invention achieves the desired interfacing as follows.

Multiple reference circuit means 16 supplies several reference signals, at a variety of voltage levels, to select circuit means 18. Each of the reference signals supplied by multiple reference circuit means 16 is a fixed percentage of the supply voltage on line 12. Select circuit means 18 couples a first reference signal from multiple reference circuit means 16 to line 26, which is connected to the positive reference of interfacing circuit means 30. Select circuit means 16 couples a second reference signal from multiple reference circuit means 16 to line 28, which is connected to the negative reference of interfacing circuit means 30.

Because the reference signals supplied by multiple reference circuit means 16 are a fixed percentage of the supply voltage, they vary in proportion to variations in the supply voltage. The interface circuit means 30 performs analog to digital conversions and digital to analog conversions in relation to the positive and negative reference signals on lines 26 and 28. If the positive and negative reference signals on lines 26 and 28 vary in proportion to the supply voltage, then the functions of interface circuit means 30 vary in proportion to supply voltage. Since the functioning of analog circuitry 36 also varies in proportion to supply voltage, then the system is rendered insensitive to these variations because the interface to the digital circuitry 22 at line 32 remains insensitive to variations in supply voltage.

If, on the other hand, the positive and negative references for interface circuit means 30 were coupled to fixed voltage supplies, the interfacing between the digital and analog circuitry would vary with variations in supply voltage.

Advantageously, multiple reference circuit means 16 provides several reference signals, any two of which may be selected by select means 18 as the positive and negative references coupled to lines 26 and 28 and to interface circuit means 30. In this manner, a single circuit may be designed for a variety of implementations in which the positive and negative references for interface circuit means 30, and the span between those references, may vary from implementation to implementation.

Figure 2:
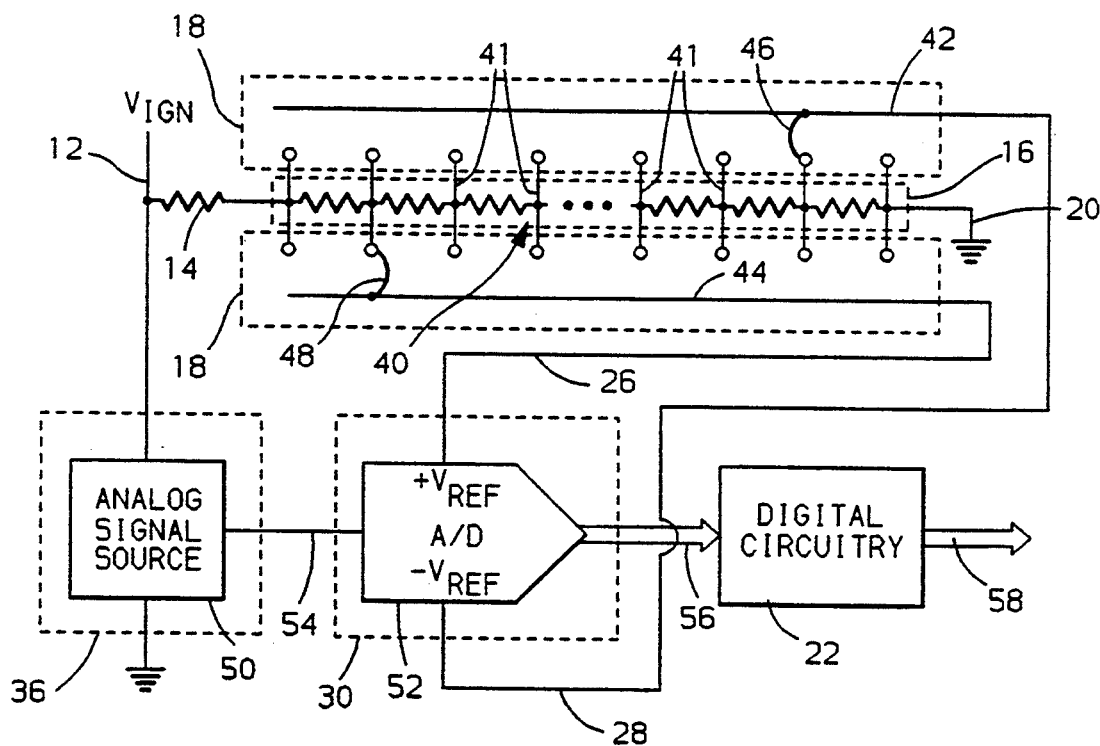
FIG. 2 is an example circuit implementation of this invention for use with analog to digital signal conversion.

Referring to FIG. 2, an implementation of this invention suitable for use in motor vehicle systems is shown. Analog circuitry 36 comprises an analog signal source 50 coupled between the unregulated vehicle voltage supply, Vign, on line 12, and ground. The analog signal source 50 outputs an analog signal on line 54 such as a signal indicative of a vehicle parameter. The analog signal on line 54 varies in relation to the supply voltage.

The multiple reference circuit means 16 comprises a resistor chain 40, which includes a series of resistors fabricated onto an integrated circuit. The resistor chain may comprise anywhere from just a few resistors to several hundred.

Between each resistor in the resistor chain, a tap 41 is placed and the tap 41 carries a signal proportional to the vehicle supply voltage in relation to the total resistance in the resistor chain between the specific tap and ground and the total resistance in the resistor chain between the specific tap and the top of the chain summed with the resistance of resistor 14. The taps extend along both sides of the resistor chain 40 into the two portions of select means 18.

Select means 18 comprises two terminals 42 and 44, one terminal running along each side of resistor chain 40 adjacent to the taps 41. One of the terminals is connected to line 26 and the other terminal is connected to line 28. During integrated circuit fabrication, the reference voltages for lines 26 and 28 are set through metal contacts 46 and 48 that are placed in the integrated circuit to couple the desired taps 41 to terminals 42 and 44. Flexibility in the circuit application is easily achieved by varying the contacts 46 and 48 for different circuit applications.

The interface circuit means 30 comprises an analog to digital converter 52, which converts the analog signal on line 54 to a digital signal on bus 56. Lines 26 and 28 are connected to the positive and negative reference inputs of analog to digital converter 52.

The digital output signal of analog to digital converter 52 is a digital signal relational to the magnitude of the signal on line 54 relative to the negative reference signal on line 28 and the positive reference signal on line 26. For example, if the output of analog to digital converter 52 has an eight bit precision and the signal on line 54 is below the signal on line 28, the output on bus 56 is 0. If the signal on line 54 is half way between the negative and positive reference signals on line 28 and 26, the output on bus 56 is 128. Likewise if the signal on line 54 is n% between the negative and positive reference signals on lines 28 and 26, the output on bus 56 is n% of 255.

The signal on line 54 varies with the supply voltage on line 12. For example assuming that the supply voltage on line 12 is increased temporarily by 5 percent. The signal on line 54, assuming the signal source remains constant, also increases by 5 percent. Additionally, the signals on lines 26 and 28 also increase by 5 percent. It can be shown that because the signals on lines 54, 26 and 28 vary in proportion to the signal on line 12, the signal on bus 56 does not vary. This is true regardless of which taps 41 are selected to be coupled to terminals 42 and 44, as long as the signal on line 26 is greater than the signal on line 28.

Because the signal on bus 56 is not affected by variations in supply voltage on line 12, the digital circuitry 22, which processes the data, is also not affected by the variations in supply voltage on line 12. Digital circuitry 22 may be any sort of suitable processing circuitry, including digital filters, microprocessors, etc., well known to those skilled in the art. Specific examples of digital circuitry 22 are set forth in the above mentioned copending patent U.S. patent application Ser. Nos. 07/944,158, 07/944,154, 07/944,140, and 07/943,964. Bus 58 carries the output signal from digital circuitry 22.

Figure 3:
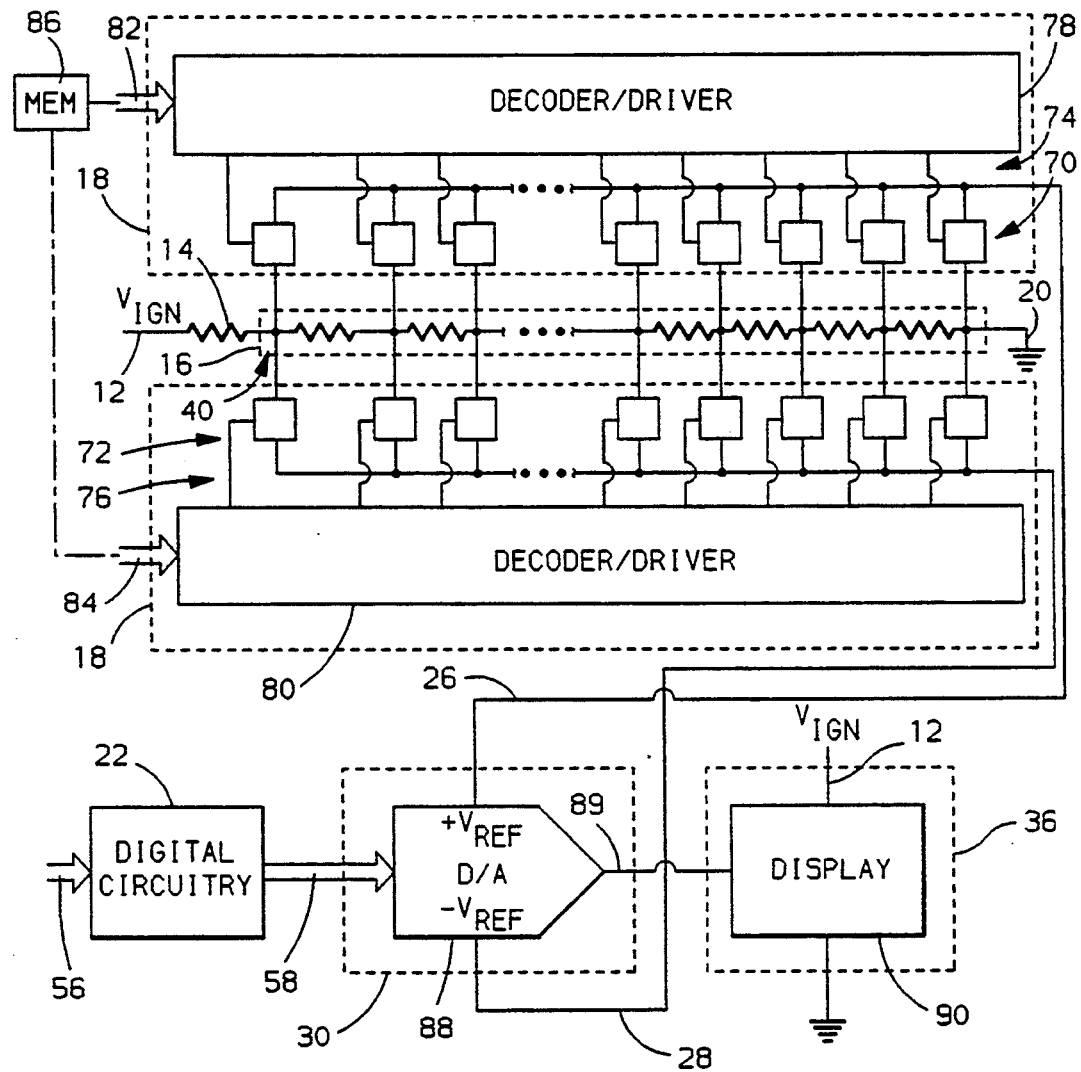
FIG. 3 is an example circuit implementation of this invention for use with digital to analog conversion.

Referring to FIG. 3, the output of digital circuitry 22 on bus 58 may be used to drive analog circuitry that is coupled to the vehicle supply voltage and, like the analog circuitry 36 in FIG. 2, functions in a way that varies in relation to variations in the vehicle supply voltage. In this example also, the invention is implemented to maintain a ratiometric relationship between digital circuitry 22 and analog circuitry 36.

The signal on bus 58 output from digital circuitry 22 is input to digital to analog converter 88, which outputs an analog signal on line 89 used to drive the display 90 of analog circuitry 36. The display 90 may be, for example, any type of air core gauge well known to those skilled in the display arts. The display 90 is connected to the vehicle supply voltage through line 12.

Typically air core gauges comprise at least two coils surrounding a magnetic rotor. One of the coils is typically coupled between the vehicle supply voltage and ground and the other is coupled between the input signal, i.e., on line 89, and ground. The coils create a composite magnetic vector which varies in relation to the signal on line 89, and the magnetic rotor rotates to align itself with the composite magnetic vector, which causes a pointer attached to a spindle to rotate in the display. Normally, if the vehicle supply voltage varies, the direction of the composite magnetic vector is varied causing the pointer to vary its position in response. The circuit applying this invention prevents this variation.

Figure 4:
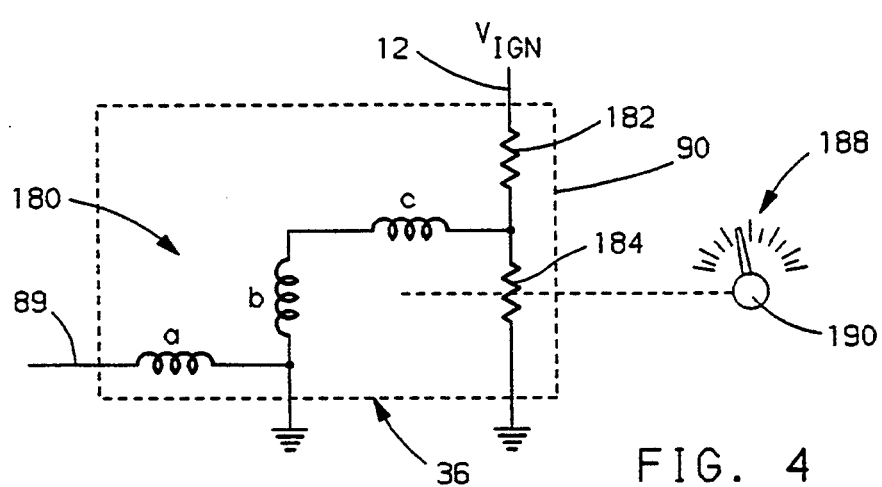
FIG. 4 is an example analog circuit display.

FIG. 4 shows an example display including three coil air core gauge 180, comprising coils a, b and c. Coil a is coupled between line 89 and ground and coils b and c are biased by resistors 182 and 184, coupled between the vehicle supply voltage line 12 and ground. Because resistors 182 and 184 are coupled between vehicle supply voltage and ground, the voltage across coils b and c of gauge 180 varies in relation to vehicle supply voltage on line 12. Without the advantages of this invention, variation in the supply voltage has an effect on the position of pointer 190 relative to graphics 188. However, when the gauge 180 is used with the apparatus of this invention as shown in FIG. 3, the signal on line 89 varies with variations in the vehicle supply voltage, varying the magnetic flux produced by coil a in a manner to nullify the affects of the variation of the voltage across coils b and c so that there is no net position change in pointer 190 due to variations in vehicle supply voltage.

Referring again to FIG. 3, multiple reference circuit means 16 comprises a resistor chain 40 as in the circuit shown in FIG. 2. The select means 18 comprises two sets of transmission gates 70 and 72 and two decoder driver circuits 78 and 80. Each set of transmission gates 70 and 72 comprises one transmission gate for every tap in resistor chain 40. Each decoder/driver 78, 80 has one output line for each transmission gate. Each of the transmission gates 70, 72, when activated, couples one of the lines 26, 28 to one of the taps in resistor chain 40. The control inputs for the transmission gates 70, 72 are connected to the output lines 74, 76 of decoder/drivers 78 and 80.

Input buses 82 and 84 for decoder/drivers 78 and 80 carry digital signals. Each digital signal input to decoder driver 82 selects one of the output lines 74 to control one of the transmission gates 70, coupling one tap in resistor chain 40, carrying a first reference signal, to line 26. Likewise, each digital signal input to decoder driver 80 selects one of the output lines 76 to control one of the transmission gates 72, coupling a second tap in resistor chain 40, carrying a second reference signal, to line 28.

In this manner the signals on buses 82 and 84 control the reference signals on lines 26 and 28. The lines 26 and 28 are coupled to the positive and negative reference inputs of digital to analog converter 88, whereby, similar to analog to digital converter 52 in FIG. 2, digital to analog converter 88 maintains an interface between digital circuitry 22 and analog circuitry 36 in a manner unaffected by variations in the vehicle supply voltage. More specifically and as described above, the functions of display 90 vary in direct relation to the ignition voltage. The positive and negative references to digital to analog converter 88 (signals in lines 26 and 28) also vary in direct relation to ignition voltage. Because of the manner of referencing digital to analog converter 88, the signal on line 89 varies in direct relation to ignition voltage, compensating for the effects of ignition voltage on display 90. The net result is that the functioning of the system is unaffected by variations in ignition voltage.

The circuit shown in FIG. 3 is very flexible in application. Buses 82 and 84 may be simply hardwired to carry specific digital signals to select the reference signals for lines 26 and 28. Alternatively, buses 82 and 84 may be coupled to memory 86, in which words may be stored to control decoder/drivers 78 and 80. In this manner, flexibility in the apparatus shown is achieved by simply changing the word stored in memory 86, or, if the memory is not used, rewiring buses 82 and 84.

Figure 5:
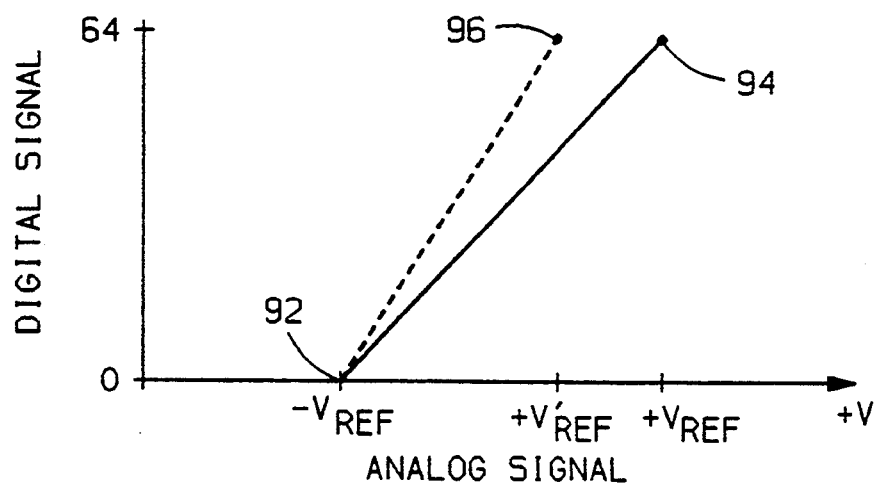
FIG. 5 is an input/output graph illustrating the design flexibility of this invention.

Referring to FIG. 5, the graph shown illustrates example offset and slope conversion by interface circuit means 30. The offset, e.g., point 92, is determined by the negative references signal. The slope of the conversion is determined by the positive reference signal, e.g., points 94 or 96. Because the select circuit means 18 of this invention allows the positive and negative reference signals to be set from a variety of signals, this invention advantageously offers flexible design into the offset and/or slope of the conversion functions performed by interface circuit means 30.

Figure 6A:
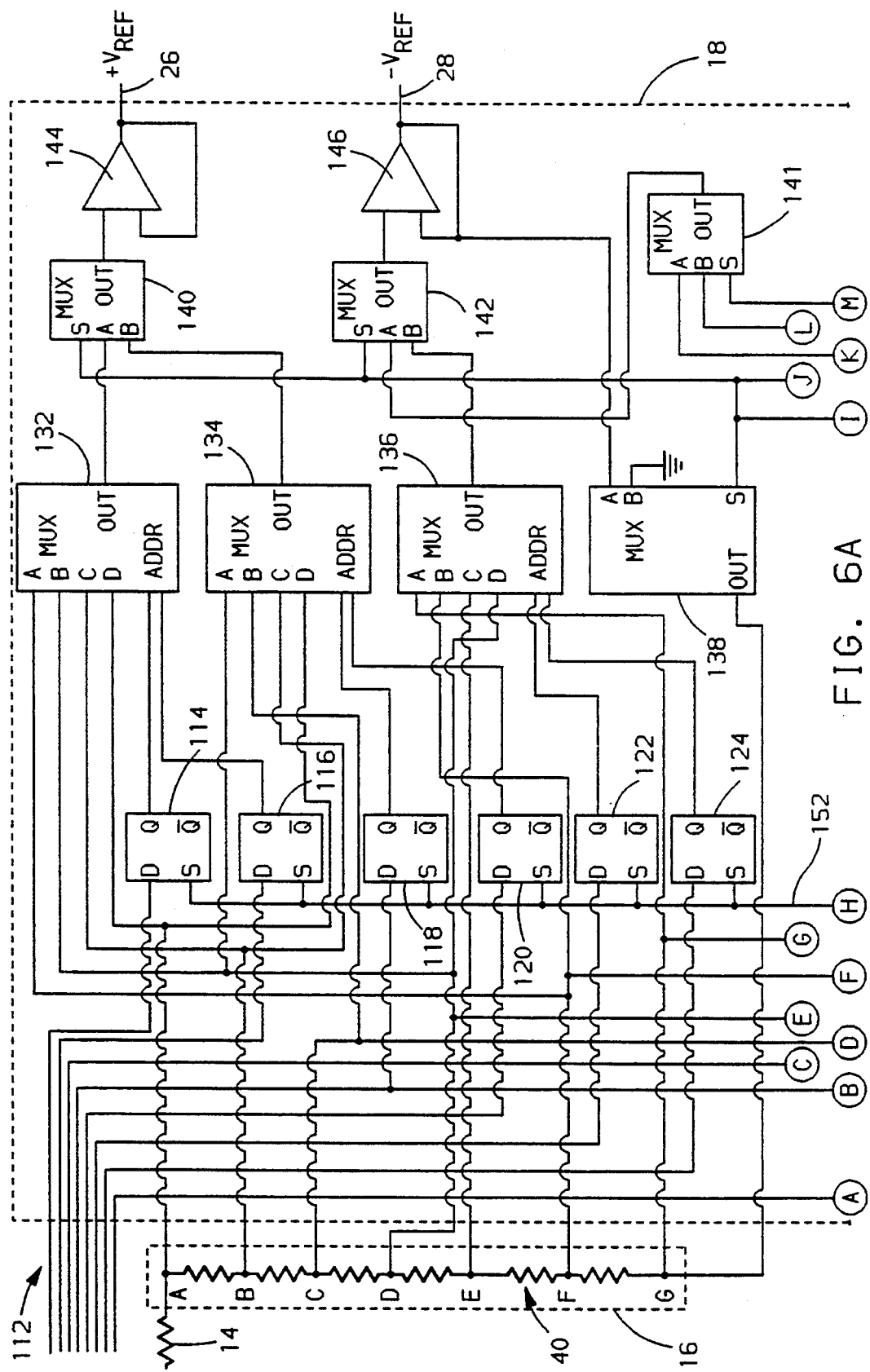
FIGS. 6A and 6B are circuit diagrams of an alternative implementation of this invention.
Figure 6B:
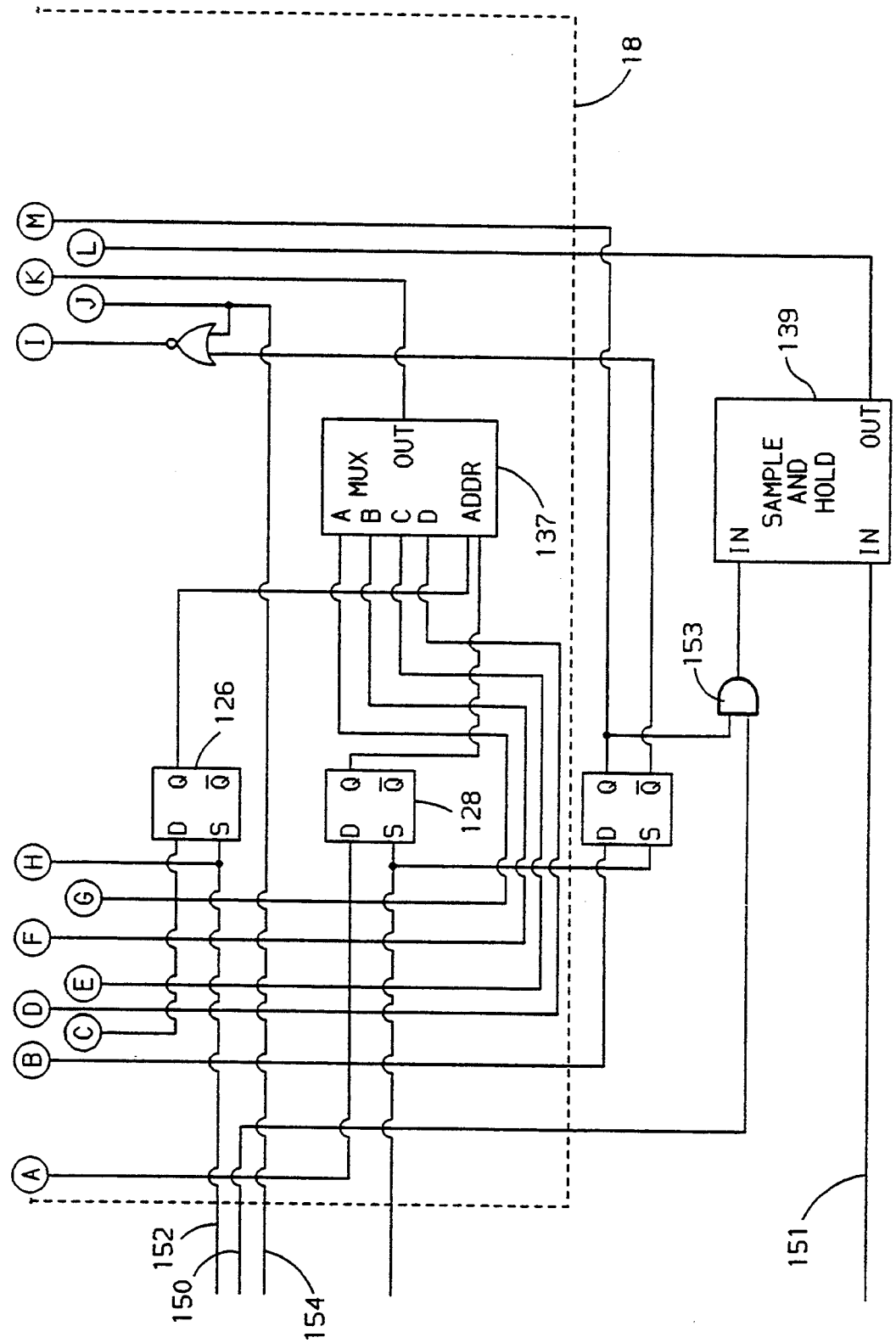

Referring to FIG. 6, an example is shown in which the multiple reference circuit means 16 comprises a series chain of six resistors 40 with tap points a–g. Taps a, b, c, d, and f are coupled to different data inputs of multiplexers 132 and 134. Taps d, e, f and g are coupled to data inputs of multiplexer 136 and taps c, d, f and g are coupled to the data inputs of multiplexer 137. Lines 112 are coupled to the data inputs of data latches 114–130. The data latches 114–130 latch the signals from lines 112 to their Q outputs when a control signal in lines 152 and 152' is received, thereby addressing multiplexers 132, 134, 136 and 137.

Multiplexers 132 and 134 couple two of the taps a, b, c, d or f to the A and B inputs of multiplexer 140, which couples one of the two input signals to its output. The output of multiplexer 140 is connected to amplifier 144, having a unity gain, which supplies the selected reference signal, a, b, c, d or f on line 26.

Multiplexer 136 couples one of the taps d, e, f or g to the B input of multiplexer 142. The A input of multiplexer 142 is coupled to the output of multiplexer 141. Multiplexer 141 has an A input coupled to the output of multiplexer 137, which is selectively coupled to either the c, d, f or g reference signals. The B input of multiplexer 141 is coupled to the output of sample and hold (SAH) circuit 139, which is used to provide a reference signal such as a ground offset voltage provided on line 151. The SAH circuit 139 is enabled by the output of AND gate 153.

Multiplexer 138 controls the ground reference for resistor chain 40. When the B input of multiplexer 138 is selected, the g tap of resistor chain 40 is tied to ground. When the A input of multiplexer 138 is selected, the tap g is tied to the output line 28 of amplifier 146. If the input to amplifier 146 is coupled to the output of SAH circuit 139 via multiplexers 141 and 142, then the g tap of resistor chain 40 is coupled to the reference signal on line 151, which may be a ground offset. The output of multiplexer 142 is coupled to amplifier 146, having unity gain, which provides the selected reference signal on line 28. In this manner, the point g in resistor chain 40 and line 28 may be both tied to the same reference signal.

The select means 18 shown in FIG. 6 is designed for circuit implementations where only certain combinations of reference points a–g are necessary. For example, in a vehicle system where it is known that processing circuitry is to be coupled to one of five possible sensors, each having a different output signal range, a system of the type shown in FIG. 5 is preferred. The eight control wires 112 may either be coupled to a set of switches for selective circuit control, hard wired in fabrication, or coupled to an eight bit memory.

Figure 7:
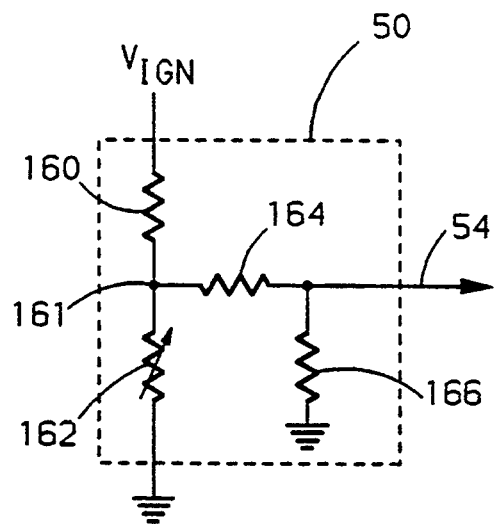
FIG. 7 is an example analog signal source circuit.

Referring to FIG. 7, a typical analog signal source circuit 50 of the type used with the circuitry of FIG. 2 is shown. A load resistor 160 and a variable impedance sender 162 are connected in series between the vehicle supply voltage and ground. The impedance of sender 162 varies in relation to a parameter to be measured. As the impedance of sender 162 varies, the voltage level at line 161 varies. A resistor divider comprising resistors 164 and 166 provides a signal on line 54 proportional to the signal at line 161, but at a voltage level suitable for processing by the interface circuit means 30.

Figure 8:
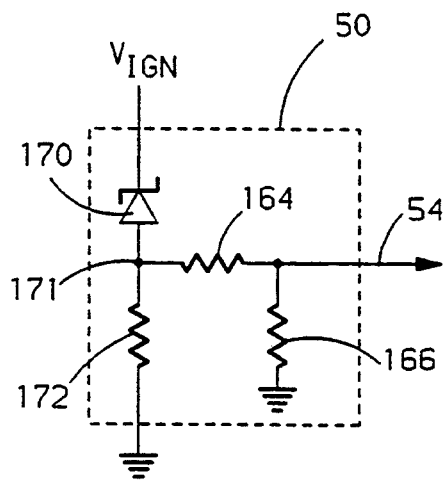
FIG. 8 is an example analog signal source circuit for use in systems where the supply voltage is measured.

A question may occur as to how ignition voltage itself is measured in a system where this invention is implemented to desensitize the circuitry to changes in ignition voltage. Referring to FIG. 8, the circuitry shown may be implemented with the circuitry of this invention to measure supply voltage.

The analog signal source 50 comprises a zener diode 170 connected in series with resistor 172 between ignition voltage and ground. An example breakdown voltage for zener diode 170 may be eight volts so that the voltage at point 171 is Vign−8 volts. In this situation, the voltage at point 171 is no longer a fixed percentage of the ignition voltage. Resistors 164 and 166 provide a signal on line 54 proportional to the signal at point 171.

Since the signal on line 54 is proportional to the signal at point 171, the signal on line 54 is not a fixed percentage of the ignition voltage. The references to the interface circuit means 30, however, are a fixed percentage of the ignition voltage so that as the ignition voltage changes the signal on line 54 changes in a non-ratiometric manner with the reference signals to the interface circuit means 30, resulting in the output of interface circuit means 30 varying with variations in the ignition voltage. This variation at the output of interface circuit means 30 may be used to drive a display in a manner to indicate the level of the ignition supply voltage.

Figure 9:
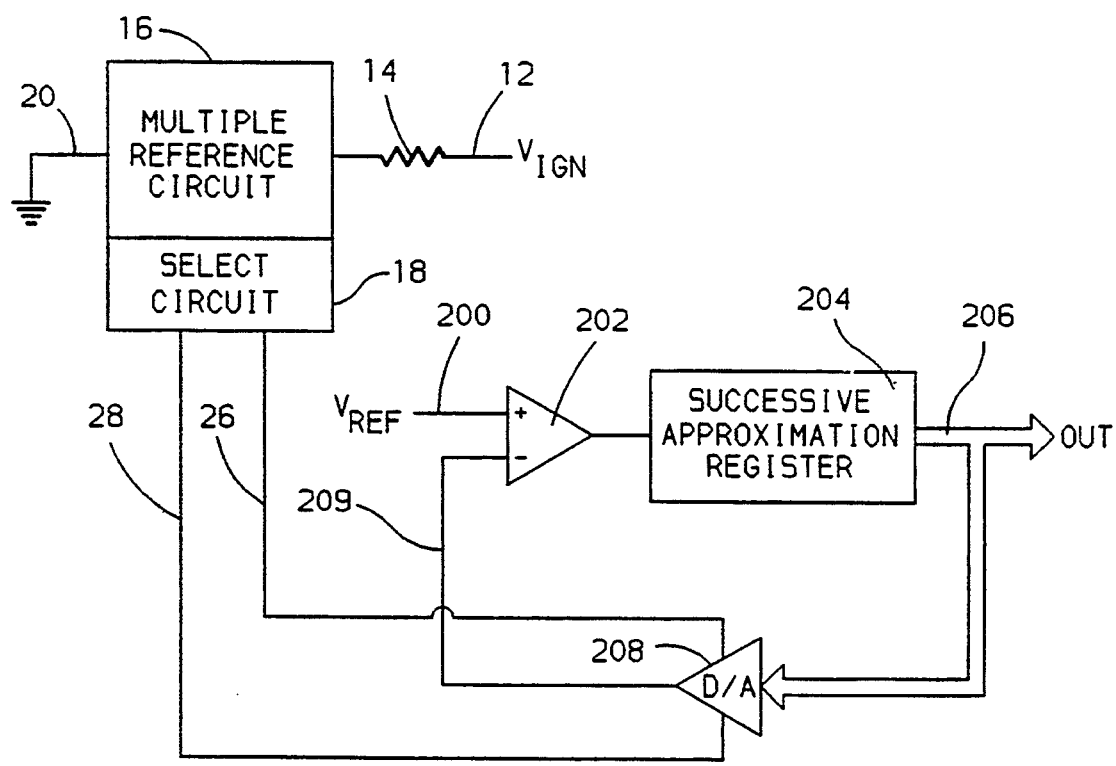
FIG. 9 is an example circuit using this invention to provide a signal indicative of vehicle supply voltage.

Referring to FIG. 9, another example of a circuit for providing an output signal of vehicle ignition voltage is shown. In the circuit, line 200 is supplied with a reference voltage provided by the integrated circuitry. A band-gap reference voltage of 1.27 volts is preferred. The band-gap reference voltage is an accurate reference signal that is relatively stable over varying temperature ranges.

The reference signal on line 200 is coupled to the non-inverting input of comparator 202. The output of comparator 202 is provided to the successive approximation register 204, which provides a digital output signal on bus 206. The output signal on bus 206 is coupled to the input of digital to analog converter 208, which has an analog output on line 209 coupled to the inverting input of comparator 202. Comparator 202, successive approximation register 204 and digital to analog converter 208 operate together in a manner to try to equalize the voltage on line 209 to the reference signal on bus 200.

Digital to analog converter 208 has a positive reference connected to line 26 and a negative reference connected to line 28. Lines 26 and 28 provide positive and negative reference signals that are proportional to the vehicle ignition voltage on line 12 in accordance with the teachings taught herein. The positive reference signal on line 26 must be greater than the reference signal on line 200 and the negative reference signal on line 28 must be less than the reference signal on line 200. If the resistor 14 provides a voltage drop so that the voltage at the connection of resistor 14 with the multiple reference circuit 16 is approximately 5 volts when the ignition voltage is 18.5 volts, then it is preferable that line 26 be referenced to 75% of the voltage input to the integrated circuit and that line 28 is referenced to 25% of the voltage input to the integrated circuit.

As the vehicle ignition voltage on line 12 varies, the reference signals on lines 26 and 28 also vary, but the reference signal on line 200 remains fixed. As the signals on lines 26 and 28 vary, the successive approximation register must vary the signal on bus 206 to force digital to analog converter 208 to provide a signal on line 209 equal to the reference signal on line 200. The resulting signal on bus 206 is be used as an indication of vehicle ignition voltage.

If the references given are used, and the successive approximation register and digital to analog converter have eight bits of precision, for voltages on line 12 varying from 18.5 to 6.6 volts, the range of signals on bus 206 varies from 2 to 235, providing relatively high output resolution.

The vehicle ignition voltage may be displayed by either coupling bus 206 to a digital display or by converting the signal on line 206 to an analog signal in accordance with the teachings of this invention and using the resulting analog signal to drive an analog display, such as the type shown in FIG. 4.

The above described apparatus of this invention provides a system in which analog circuits connected to unregulated voltage supplies may be interfaced with digital circuits connected to regulated voltage supplies, while maintaining a ratiometric relationship between analog and digital data.

The above described implementations of this invention are example implementations and are not meant to be limiting in scope. Moreover, various other improvements and modifications to this invention may occur to those skilled in the art and fall within the scope of this invention as set forth below.

The embodiments of the invention in which an exclusive property or privilege is claimed are defined as follows:

1. A circuit apparatus comprising:
   multiple reference circuit means, coupled to an unregulated voltage supply, for providing multiple reference signals at a variety of voltage levels that vary in relation to variations of the unregulated voltage supply;
   analog circuitry coupled to the unregulated voltage supply for performing operations that vary in relation to variations of the unregulated voltage supply;
   digital circuitry having a regulated voltage supply coupled to the unregulated voltage supply for rendering operations performed by the digital circuitry insensitive to variations in the unregulated voltage supply;
   means for interfacing the digital and analog circuitry, the interfacing means having positive and negative reference inputs and performing conversion between analog and digital signals, the conversion varying in relation to reference voltage levels applied to the positive and negative reference inputs; and
   select means for coupling the positive reference input of the interfacing means to a first reference signal of the multiple reference circuit means and for coupling the negative reference input of the interfacing means to a second reference signal of the multiple reference circuit means, wherein variations in operations performed by the analog circuitry due to the unregulated voltage supply compensate for variations in the conversion between analog and digital signals due to the unregulated power supply to maintain a ratiometric relationship between the analog and digital circuitry.

2. The circuit apparatus of claim 1, wherein:

the analog circuitry provides an analog output signal which varies with variations in the unregulated voltage supply;

the interfacing means comprises an analog to digital converter that converts the analog output signal provided by analog circuitry to a converter digital output signal, which is unaffected by variations in the unregulated voltage supply, and wherein the digital circuitry process the converter digital output signal.

3. The circuit apparatus of claim 1, wherein: the multiple reference circuit means comprises a series of resistors in a resistor chain coupled between the unregulated voltage supply and ground.

4. The circuit apparatus of claim 1, wherein:

the digital circuitry provides a digital output signal that is unaffected by the variations in the unregulated voltage supply;

the interfacing means comprises a digital to analog converter that converts the digital output signal to a converter analog output signal, which varies in proportion to variations in the unregulated voltage supply, and wherein the variations in the converter analog output signal vary in relation to the variations in the operations of the analog circuitry so that overall the circuit apparatus is unaffected by the variations in the unregulated voltage supply.

5. The apparatus set forth in claim 1 wherein the interfacing means has a transfer function for converting between analog and digital signals with a slope and an offset, wherein the slope and offset of the transfer function are variable depending upon the first and second reference signals coupled to the interfacing means.

6. A circuit apparatus comprising:

multiple reference circuit means, coupled to an unregulated voltage supply, for providing multiple reference signals at a variety of signal levels, the multiple reference circuit means comprising a series of resistors in a resistor chain coupled between the unregulated voltage supply and ground, wherein two sets of taps are connected to the series of resistors, one set of taps having one tap connected at each series connection in the resistor series on a first side of the resistor chain, the other set of taps having one tap connected at each series connection of the resistor series on a second side of the resistor chain opposite the first side;

means for interfacing digital and analog circuitry having positive and negative reference inputs; and select means for coupling the positive reference input of the interfacing means to a first reference signal of the multiple reference circuit means and for coupling the negative reference input of the interfacing means to a second reference signal of the multiple reference circuit means, the select means comprising first and second terminals coupled to the positive and negative reference inputs of the interfacing means, the first terminal running along the first side of the resistor chain in proximity to one set of taps and the second terminal running along the second side of the resistor chain in proximity to the other set of taps, the first terminal coupled to a first tap in the one set of taps and the second terminal coupled to a second tap in the other set of taps, whereby a ratiometric relationship between the analog and digital circuitry is maintained.

7. A circuit apparatus comprising:

multiple reference circuit means, coupled to an unregulated voltage supply, for providing multiple reference signals at a variety of signal levels, the multiple reference circuit means comprising a series of resistors in a resistor chain coupled between the unregulated voltage supply and ground, wherein the resistor chain has a set of series connections, one series connection between each adjacent pair of resistors in the chain;

means for interfacing digital and analog circuitry having positive and negative reference inputs; and select means for coupling the positive reference input of the interfacing means to a first reference signal of the multiple reference circuit means and for coupling the negative reference input of the interfacing means to a second reference signal of the multiple reference circuit means, the select means comprising first and second pluralities of transmission gates, the first plurality of gates coupled to the positive reference input of the interfacing means with each gate of the first plurality coupled to a different series connection in the resistor chain, the second plurality of gates coupled to the negative reference input of the interfacing means with each gate of the second plurality coupled to a different series connection in the resistor chain, the select means also including a first decoder/driver having a first set of output lines selectively controlling the first plurality of transmission gates to selectively couple the positive reference input of the interfacing means to series connections in the resistor chain, and a second decoder/driver having a second set of output lines selectively controlling the second plurality of transmission gates to selectively couple the negative reference input of the interfacing means to series connections in the resistor chain, whereby a ratiometric relationship between the analog and digital circuitry is maintained.

8. The apparatus of set forth in claim 7, wherein the decoder/drivers selectively control the transmission gates responsive to control signals stored in memory means.

9. A circuit apparatus comprising:

multiple reference circuit means, coupled to an unregulated voltage supply, for providing multiple reference signals at a variety of signal levels, the multiple reference circuit means comprising a series of resistors in a resistor chain coupled between the unregulated voltage supply and ground, the resistor chain having a set of series connections, one series connection between each adjacent pair of resistors in the chain;

means for interfacing digital and analog circuitry having positive and negative reference inputs; and select means for coupling the positive reference input of the interfacing means to a first reference signal of the multiple reference circuit means and for coupling the negative reference input of the interfacing means to a second reference signal of the multiple reference circuit means, the select means comprising at least two multiplexers, one of the multiplexers selectively controlled to couple one of the series connections in the resistor chain to the positive reference input of the interfacing means and the other of the multiplexers selectively controlled to couple another of the series connections in the resistor chain to the negative reference input of the interfacing means, whereby a ratiometric relationship between the analog and digital circuitry is maintained.

10. The apparatus set forth in claim 9, wherein the multiplexers are selectively controlled via control signals stored in a memory means.

* * * * *